United States Patent [19]
Arnold et al.

[11] Patent Number: 5,825,624
[45] Date of Patent: *Oct. 20, 1998

[54] HIGH HEAT DENSITY TRANSFER DEVICE

[75] Inventors: Judson V. Arnold, Bedford; James R. Peoples, Burleson; Elbert L. McKague, Fort Worth, all of Tex.

[73] Assignee: Lockhead Fort Worth Company, Fort Worth, Tex.

[*] Notice: The term of this patent shall not extend beyond the expiration date of Pat. No. 5,566,752.

[21] Appl. No.: 795,081

[22] Filed: Feb. 5, 1997

Related U.S. Application Data

[62] Division of Ser. No. 704,394, Aug. 27, 1996, which is a division of Ser. No. 326,650, Oct. 20, 1994, Pat. No. 5,566,752.

[51] Int. Cl.$^6$ .................................................. H05K 7/20
[52] U.S. Cl. ......................... 361/708; 165/185; 257/720; 361/717; 428/901
[58] Field of Search ................... 428/367, 375, 428/408, 901; 165/80.2, 80.3, 185, 104.33; 257/712, 713, 720; 174/16.3; 361/704, 705, 707, 708–713, 717–719

[56] References Cited

U.S. PATENT DOCUMENTS

| | | | |
|---|---|---|---|
| 3,678,995 | 7/1972 | Collard | 165/185 |
| 3,721,289 | 3/1973 | Seal | 165/80 |
| 3,828,848 | 8/1974 | Custers et al. | 165/80 |
| 3,974,518 | 8/1976 | Lewis, Jr. et al. | 357/81 |
| 4,582,954 | 4/1986 | Eaton | 174/16.3 |
| 4,867,235 | 9/1989 | Grapes | 165/185 |
| 4,966,226 | 10/1990 | Hamburger | 165/104.26 |
| 5,077,637 | 12/1991 | Martorana | 361/704 |
| 5,224,030 | 6/1993 | Banks | 361/704 |
| 5,316,080 | 5/1994 | Banks | 165/185 |
| 5,390,734 | 2/1995 | Voorhes | 361/704 |
| 5,566,752 | 10/1996 | Arnold | 165/185 |

OTHER PUBLICATIONS

Research Disclosure, #(No.) 288, Apr. 1988, England, p. 1, "Electrical Resistive —Chips".

K. V. Ravi, "*Low Pressure Diamond Synthesis for Electronic Applications,*" Materials Science and Engineering, B19 (1993), pp. 203–227.

*Primary Examiner*—Gerald P. Tolin
*Attorney, Agent, or Firm*—Baker & Botts, L.L.P.

[57] ABSTRACT

Heat transfer device (30) dissipates and removes heat energy from a heat source and delivers the heat energy to a heat sink. Heat transfer device (30) includes diamond substrate (32) for receiving the heat energy from the heat source. Interconnect point (36) connects to diamond substrate (32). Fiber (34), such as a carbon fiber, connects at interconnect point (36) to receive the heat energy from diamond substrate (32) and conduct the heat energy to the heat sink.

9 Claims, 2 Drawing Sheets

HIGH HEAT DENSITY TRANSFER DEVICE

CROSS REFERENCE TO RELATED APPLICATIONS

This application is a division of U.S. application Ser. No. 08/704,394 filed Aug. 27, 1996, which is a divisional of U.S. application Ser. No. 08/326,650 filed Oct. 20, 1994 now issued as U.S. Pat. No. 5,566,752.

TECHNICAL FIELD OF THE INVENTION

The present invention relates to heat transfer devices and, more particularly, to a method and apparatus that provide a conduction cooled device and enclosure for accommodating a high density electronic packaging and other high heat density applications.

BACKGROUND OF THE INVENTION

A problem of conventional substrate materials for electronic devices is that they possess very low thermal conductivities. This becomes a serious problem as circuit densities increase. Electronic device packages with greater circuit densities, because of the heat that electricity generates, produce greater heat densities. This affects circuit performance and may adversely affect entire electronic system operation. Since many military vehicles depend on sophisticated electronic systems that have these types of circuit cooling limitations, solving these problems could significantly improve operational capabilities of these vehicles.

A related problem is that systems that use known substrate materials generally rely on convection mechanisms such as air flow, water flow, or other flow mechanisms for heat dissipation. Relying on these types of cooling systems increases the costs of the electronic systems and may make them unaffordable. Liquid cooling components for these types of electronic systems include pumping stations and cooling towers for convection cooling. Such systems are heavy, complicated, and consume significant amounts of power. These cooling limitations also dictate the location and space requirements for the electronic systems in the vehicle. For aircraft, these considerations directly affect operational and engine requirements as well as the general expense of the aircraft. As electronic circuits become more compact, this system inflexibility may prohibit their practical use on certain vehicles, including, for example, sophisticated military aircraft.

SUMMARY OF THE INVENTION

Therefore, a need exists for an improved method and apparatus for heat dissipation from a variety of high heat density sources.

A further need exists for a method and apparatus for dissipating heat from electronic systems more efficiently that allows more miniaturization and increases the design flexibility of electronic systems by eliminating or substantially reducing the requirement that the electronic systems be located near an air or liquid cooling system.

The present invention, therefore, provides a heat transfer device for high heat density sources that substantially eliminates or reduces disadvantages and problems associated with previously developed methods of dissipating heat from such sources.

Accordingly, one aspect of the present invention is an apparatus for moving heat from a heat source to a heat sink that includes a diamond substrate for receiving the heat energy from the high heat density source and dissipating and transferring the heat energy. An interconnect point connects to the diamond substrate. Fibers, such as carbon fibers, connect at the interconnect point to receive the heat energy from the diamond substrate and conduct the heat energy to the heat sink.

A technical advantage of the present invention is that it makes possible the use of diamond substrate technology in the fabrication of electronic devices. The present invention provides a connection between high thermal conductivity pitch fiber and polycrystalline diamond substrate formed in an acetylene torch-based chemical vapor deposition process. Pitch fiber is an efficient mover of heat, but is highly directional in heat transfer and poorly suited for service as a substrate material. Diamond, on the other hand, makes an ideal substrate material, but is inflexible for making connections to a heat sink. The methodology of the present embodiment, therefore, optimally uses the characteristics of pitch fiber and polycrystalline diamond to move heat from the high heat density source to a heat sink.

Other technical advantages that the present invention provides include making it possible to design greater power densities in electronic components than are possible with known heat transfer mechanisms, permitting the use of lighter weight components than are practical with systems that require the use of heat planes and convection cooling for heat dissipation, and allowing for more robust fabrication processes than are otherwise possible due to heat density limitations. As a result, smaller and more dense electronic components and circuits with higher clock speeds may be formed using the present embodiment.

Another technical advantage of the present invention is that it moves heat to and through the pitch fiber in a manner that is similar to how an electronic circuit moves electricity through conducting metal. This permits a greater degree of freedom in fabricating a wide variety of electronic devices.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGURES, like numerals being used to refer to like and corresponding parts of the various drawings.

Figure 1:
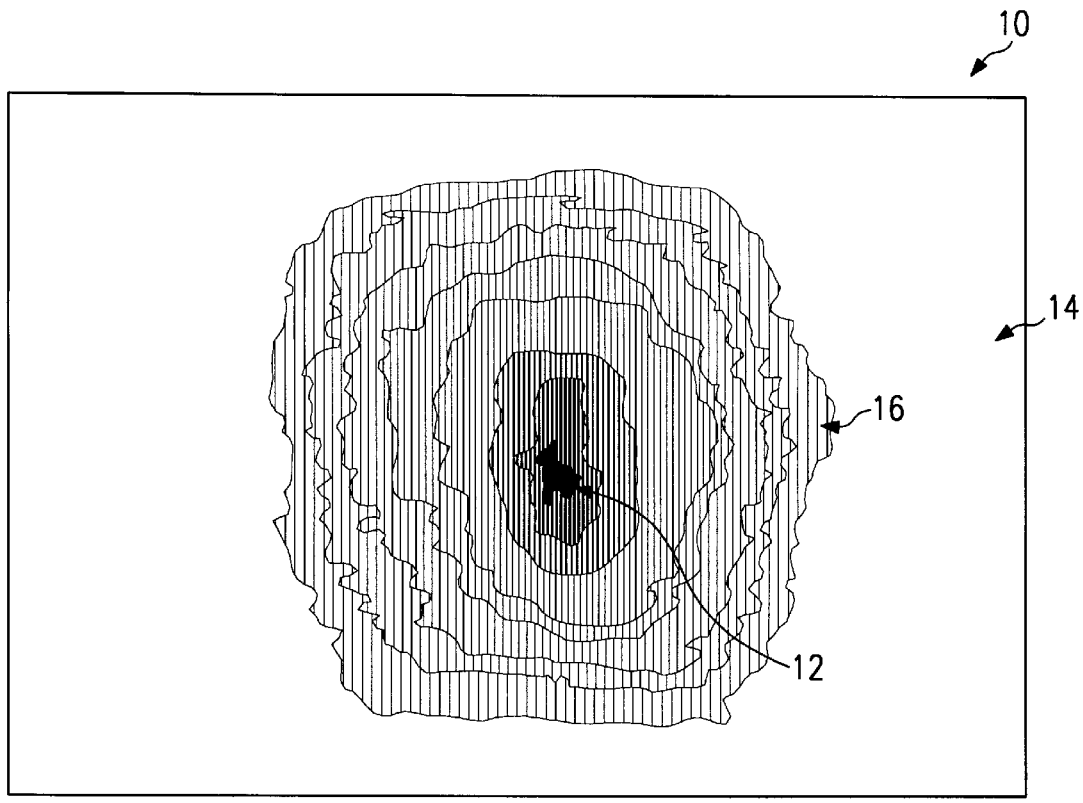
FIG. 1 provides a heat signature diagram to demonstrate the heat transfer and distribution characteristics of a conventional alumina heat plane for an electronic package.

FIG. 1 shows the heat distribution within alumina substrate 10 as heat source 12 generates heat into the substrate 10 center. As lines 14 indicate, a greatest concentration of heat energy forms in region 16 which is closest to heat source 12. Because of its relatively low thermal conductivity, alumina substrate 10 does not distribute heat energy effectively. This results in undesirable hot spots on alumina substrate 10.

Figure 2:
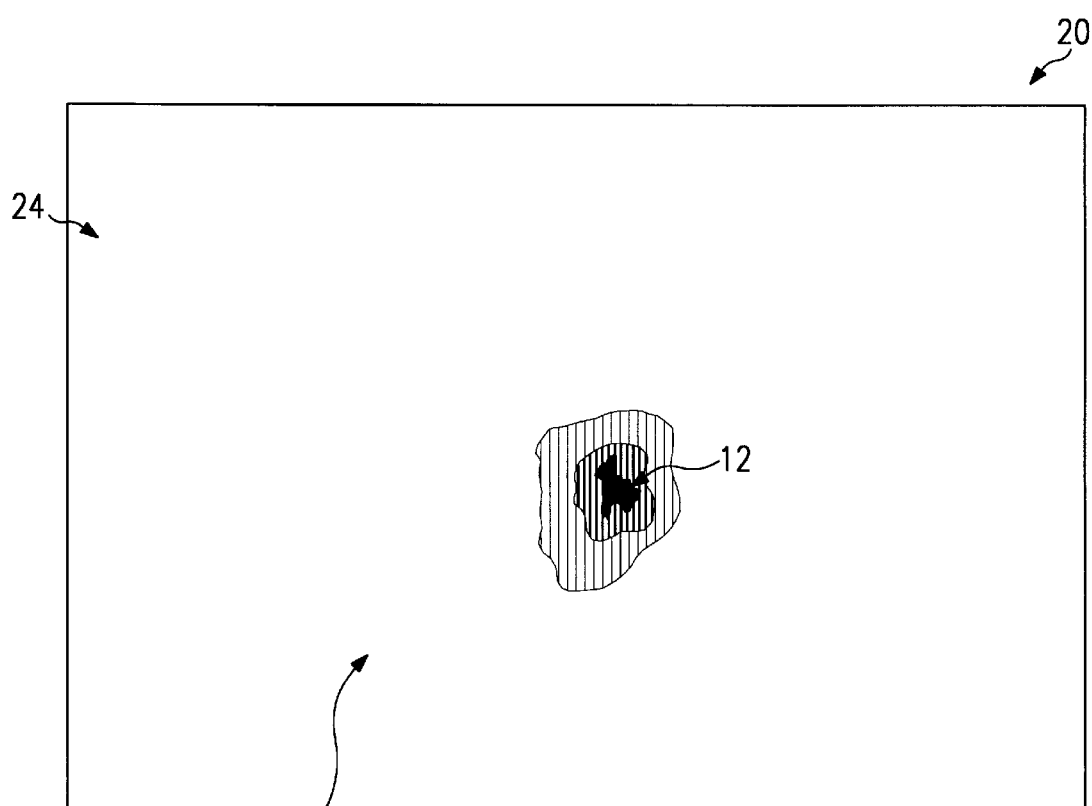
FIG. 2 shows a heat signature diagram of a diamond substrate to demonstrate heat transfer and distribution characteristics of the present embodiment.

FIG. 2 shows diamond substrate 20 into which heat source 12 deposits the same amount of heat energy as enters alumina substrate 10 of FIG. 1. FIG. 2, in contrast to FIG. 1, shows a significant increase in heat distribution. In fact, lines 22 and 24 show no differences in temperature across the entire surface of diamond substrate 20. The present invention takes advantage of this attractive heat distribution property of diamond material as the following discussion illustrates.

Diamond is an excellent heat conductor and has the added benefit of being innocuous during fabrication in the sense that diamond will not go into solution at temperatures under about 800° C. Diamond is impervious to chemical attack, possesses a low friction coefficient, and is extremely hard but very light in weight. Diamond may even possess a thermal conductivity that is numerous times that of copper. For example, the diamond substrate for the present embodiment uses chemical vapor deposited (CVD) diamond having a thermal conductivity of greater than 5 W/cm-°K. Important properties of diamond for electronic device applications are listed in the following TABLE 1:

TABLE 1

VALUES OF DIAMOND PROPERTIES

| PROPERTY | DIAMOND VALUE |
| --- | --- |
| Chemical Reactivity | Extremely Low |
| Hardness (kg/mm$^2$) | 9000 |
| Thermal Conductivity (W/cm °K.)* | 20 |
| Tensile Strength (psi)* | $0.5 \times 10^6$ |
| Compressive Strength (psi)* | $14 \times 10^6$ |
| Thermal Expansion Coeffient (°K.$^{-1}$) | $0.8 \times 10^6$ |
| Refractive Index | 2.41 @ 590 nm |
| Transmissivity | 225 nm - far IR |
| Coefficient of Friction | 0.05 (dry) |
| Band Gap (eV) | 5.4 |
| Electrical Resistivity (Ω-cm)* | $1 \times 10^{16}$ |
| Density (gm/cm$^3$) | 3.51 |
| Hole Mobility (cm$^2$/V-s) | 1600 |
| Electron Mobility (cm$^2$/V-s) | 1900 |
| Breakdown Field (cm$^2$/V-s) | $\geq 1 \times 10^7$ |
| Electron Velocity (cm/s) | $2.7 \times 10^7$ |
| Dielectric Constant | 5.5 |
| Lattice Constant (A) | 3.57 |

*These values are for natural diamond.

Figure 3:
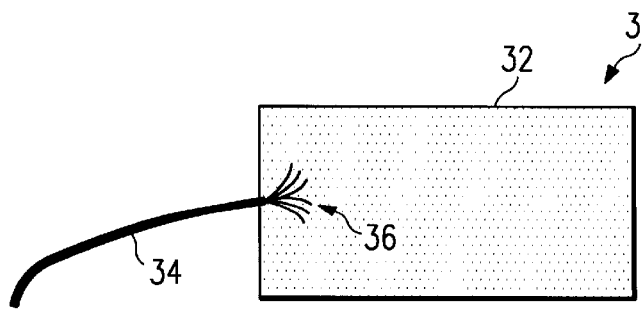
FIG. 3 illustrates a top view of a diamond substrate structure employing the present embodiment of the invention.

FIG. 3 shows one embodiment of heat transfer device 30 of the present invention that includes diamond substrate 32 to which fibers 34 attaches. Fibers 34 attaches to diamond substrate 32 at interconnect point 36 which is a fusing of fibers 34 with diamond substrate 32. In the present embodiment, the fiber bundle 34 is fanned or spread to form interconnect point 36 and provides a maximum surface area to diamond substrate 32. In the FIG. 3 structure, heat travels through the center of each of the fibers 34. Fibers 34, therefore, establishes a path for heat energy so that heat from diamond substrate 32 may transfer or flow to a heat sink.

Figure 4:
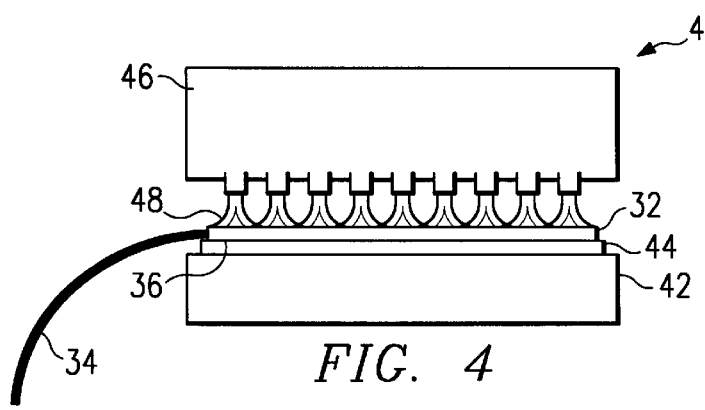
FIG. 4 shows a conceptual diagram of a process for forming the structure of FIG. 3.

FIG. 4 illustrates process flow 40 for forming heat transfer device 30 of the present embodiment. The conceptual diagram for process flow 40 includes the components of backplane 42 on which polished silicon substrate 44 is positioned. Fiber 34 is first adhered to or placed on polished silicon substrate 44. Then, diamond substrate 32 is formed on substrate 44 and interconnect point 36. Combustion torch 46 deposits diamond substrate 32 using numerous acetylene jets 48. Process flow 40 is an acetylene process in which fiber 34 is laid into the shape and position for the completed heat transfer device 30. Diamond is deposited by heating silicon substrate 44 with combustion torch 46.

K. V. Ravi, *Low Pressure Diamond Synthesis for Electronic Applications*, MATERIALS SCI. & ENG'G, B19 (1993) 203–227, describes numerous methods for diamond substrate deposition (hereinafter Ravi). This article is here incorporated by reference. An important aspect of the present process is that it provides a mirror finish surface on the side that contacts silicon substrate 44. To obtain this mirror finish surface, the present embodiment uses a process similar to the combustion flame synthesis process described in Ravi.

Figure 5:
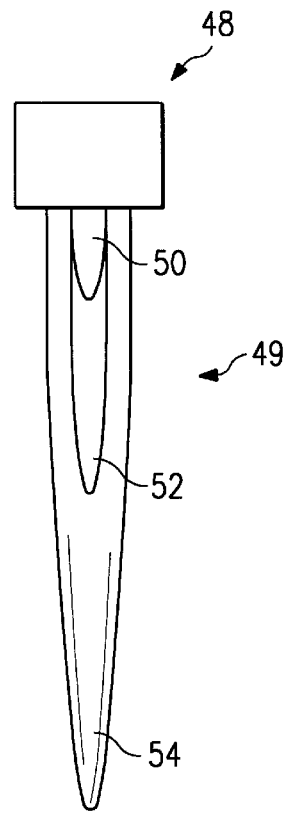
FIG. 5 shows an acetylene torch flame for the process of the present embodiment.

FIG. 5, to more particularly describe this process, shows one embodiment of acetylene jet 48, many of which form combustion torch 46. Acetylene jet 48 forms flame 49 that includes an inner core region 50 within acetylene feather 52. Outer flame 54 surrounds acetylene feather 52 and inner core 50.

Figure 6:
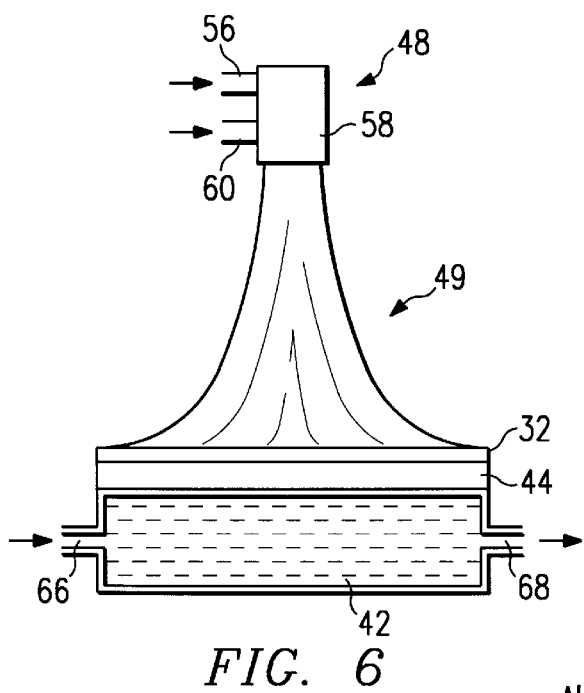
FIG. 6 illustrates how one of the many acetylene torches of the described method forms the diamond substrate of the present embodiment.

FIG. 6 shows how acetylene jet 48 forms diamond substrate 32 of the present embodiment. Through gas connection 56, oxygen enters mixture chamber 58 of acetylene jet 48. Acetylene gas enters mixture chamber 58 through connection 60. Oxygen and acetylene combine to produce oxyacetylene torch flame 49 which, due to the excess acetylene, deposits diamond substrate 32 on silicon substrate 44. Backplane 42 may provide desired temperature control by, for example, flowing cooled water into convection channel 66 and heated water out of channel 68.

In the process of FIGS. 4 through 6, the requisite energy for activating process gases is achieved by the combustion reaction between acetylene and oxygen. The excess acetylene in the gas mixture provides carbon for diamond substrate 32 formation at a temperature of approximately 1900° C. The combustion reaction between the oxygen and acetylene provides the required energy for activation.

By forming diamond substrate 32 on a highly polished silicon substrate 44, the result is a net shape that requires no polishing or is very easy to polish. In addition, the process of the present embodiment produces diamond substrate 32 at only a fraction of the costs of other diamond substrate forming methods. Another advantage of the diamond forming method of the present embodiment is the relatively high growth rates that the process achieves (e.g., an advertised rate of greater than 10 microns per hour over relatively large areas).

The deposition process of the present embodiment is a simple to practice technique of diamond synthesis from the perspective of equipment complexity. There is no need for chambers, protective atmospheres or other process limitations. In addition, the process may be scaled appropriately to take advantage of technological innovations relating to rocket nozzles and thrust development. These include, for example, computation of fluid dynamics, fluid and gas flow modeling, heat transfer modeling, nozzle design technology, and robotics and automation innovations. In addition and importantly for purposes of the present embodiment, the microstructure and phase purity control that the process of FIGS. 4 through 6 provides is more readily accomplished than with other techniques. The result of the process, therefore, is a high quality diamond substrate 32 that may be used for a variety of applications, including as a heat transfer mechanism for electronic devices.

Another important aspect of the present embodiment is to consider that it is not limited to electronic device applications only. Any surface with which a diamond substrate or layer may come in contact and which has a high heat density source may benefit from the present invention. For example, by placing a diamond material near the source of heat in an internal combustion engine, it may be practical to eliminate the liquid cooled radiator systems of conventional automobiles. The present invention makes it possible to transfer heat energy from the engine, using fiber 34, to a diamond or other material radiator at which point air may blow across the radiator to remove the heat.

The present embodiment, therefore, provides a smooth, highly reflective finish on diamond substrate 32 on which an electronic device may be fabricated. This promotes the utility of the present embodiment for high heat density source applications such as electronic circuits having high circuit densities. In addition, the present embodiment provides the ability to connect carbon fibers 34 to diamond substrate 34 using interconnect point 36. This permits electronic component cooling for integrated circuits and eliminates the need for convection cooling systems that conventional circuits require. This additional circuit flexibility may save significant design and construction efforts for sophisticated electronically-capable vehicles such as fighter aircraft.

One embodiment of fiber 34 is known as pitch fiber and is produced by Amoco Corporation of Greenville, S.C. Example material description numbers for fiber 34 include P-120 and K-1100. Pitch carbon fibers such as these 34 possess the particularly attractive attribute of being able to withstand the diamond substrate deposition temperatures of 1900° C. without deteriorating or undergoing phase transformation. Moreover, for example, the P-120 fiber has a high modulus of 120 MSI with a high thermal conductivity of 6.4 W/cm°K. The K-1100 fiber possesses a negative coefficient of expansion, a modulus of at least 135 MSI, and a thermal conductivity of 11.0 W/cm-K. Pitch fibers with other similar characteristics may also be used with the present embodiment. Because pitch fiber 34 is designed to withstand temperatures in excess of 3600° C., it can easily undergo the diamond substrate 34 process without deterioration.

Pitch fiber 34 is highly directional in nature and must be bound together with some kind of matrix material. Resins are used most often, but this makes it difficult to get heat energy into fiber 34. Fiber 34, therefore, is not practical for use as a substrate. On the other hand, diamond substrate 34 makes an excellent substrate material because it possesses excellent material characteristics and a mirror finish that make substrate 34 suitable for multilayer electronic circuit applications. The mirror finish is desired to be an as-deposited mirror finish. In other words, the finish forms as diamond substrate 32 is deposited in the open torch chamber on highly polished silicon substrate 44 and the silicon is etched away.

Figure 7:
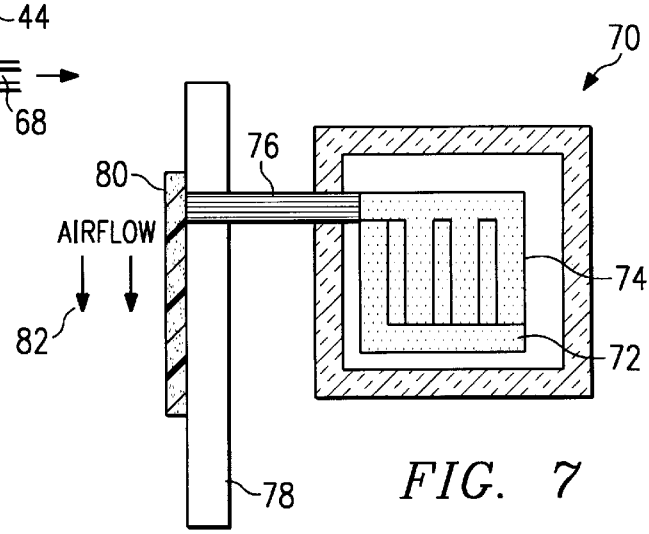
FIG. 7 depicts an alternative embodiment of the present invention.

FIG. 7 shows a further embodiment of the present invention formed within composite enclosure 70. Composite enclosure 70 includes multichip module 72 that itself includes multiple integrated circuits that are formed on diamond substrate 74. As FIG. 7 illustrates, fiber heat pipe 76 includes multiple fibers 34 that connect to multichip module 72 for conducting heat that comes from the electronic circuits. Fiber heat pipe 76 transfers this heat through a composite panel, or skin 78 of which fiber heat pipe 76 is an integral part, and to radiator device 80. Radiator device 80 may itself be a diamond or a co-cured carbon-fiber composite structure that distributes the heat energy that comes from carbon fiber heat pipe 76. Use of pitch fiber as the "heat pipe" allows co-curing as part of the composite material. This provides heat flow through the composite structure. Air flow 82 removes heat from radiator device 80.

The electronic device system that composite enclosure 70 forms may use a lightweight composite material, instead of a metallic enclosure. The composite material may be formed to shield the frequencies of the boards and the connectors of the electronic circuits within multichip module 72. Using composite materials permits tailoring the stresses, the strains, and the heat transfer characteristics of multichip module 72. Because it is possible to conduct the heat that multichip modules 72 generates, it is possible to engineer composite materials for enclosure 70 according to desired operational situations and objectives.

In addition to the increased system flexibility that composite enclosure 70 makes possible, an important point to understand is that composite enclosure 70 is not limited to silicon system design rules. Because of the increased heat removal properties of composite enclosure 70, it is possible to make each electronic circuit of multichip module 72 more compact. These more compact design rules add flexibility for even more powerful circuits with greater function and generally improved characteristics. For example, tools such as x-ray lithography, instead of photolithography, may have greater applicability with the electronic circuits of composite enclosure 70.

Although the FIG. 7 embodiment shows the example of a radiator device 80 fitting outside a vehicle or an aircraft where the atmosphere absorbs the heat, there are many other possible configurations. The FIG. 1 embodiment may radiate or transfer heat energy directly to or from a fuel tank, a towed array, an upper skin or, a lower skin of an aircraft, into cooling air/liquid streams or wherever it might be appropriate or beneficial to receive or remove heat energy. In a more specific example, one aircraft known as the National Aerospace Plane (NASP) uses slush hydrogen as a fuel that is heated prior to injecting it into a burner. Placing radiator device 80 in a storage volume for heating such a fuel may provide an efficient way of preparing the fuel, while effectively removing heat from composite enclosure 70. In this sense, composite enclosure 70 provides a ready source of controllable heat.

Here is described one method of forming heat transfer device 30. A first step is to obtain graphite fibers 34. Then a deposition reactor including combustion torch 46, which may use, for example, the torch deposition methodology of Ravi is prepared for operation. A deposition surface on silicon substrate 44 is used which is highly polished. Graphite or carbon fibers at the end of fiber 34 are spread out in a fan and placed on silicon substrate 44 to form interconnect point 36. These may be placed mechanically on silicon substrate 44. Another embodiment of the invention may be to embed pitch fiber 34 into the silicon substrate 44 surface to form an improved interconnect point 36 to facilitate attachment of fiber 34. With interconnect point 36 in place, combustion torch 46 of deposition reactor is operated and diamond substrate 32 is deposited on silicon substrate 44.

Deposition continues until interconnect point 36 is covered and diamond substrate 32 obtains some structural integrity at interconnect point 36. The structure is then removed from the deposition reactor. Silicon substrate 44 may then be etched to yield heat transfer device 30 of FIG. 3. Heat transfer device 30 then may be laser-trimmed to a desired shape.

In summary, one aspect of the present invention provides heat transfer device 30 for dissipating and removing heat energy from a heat source and delivering the heat energy to a heat sink. Heat transfer device 30 includes diamond substrate 32 for receiving the heat energy from the heat source. Interconnect point 36 connects to diamond substrate 32. Fiber 34 connects at interconnect point 36 for receiving the heat energy from diamond substrate 32 and conducting the heat energy to the heat sink.

Although the invention has been described in detail herein with reference to the illustrative embodiments, it is to be understood that this description is by way of example only and is not to be construed in a limiting sense. For example, any number of pitch fibers 34 may be used with a single diamond substrate 32 to transfer heat energy to a heat sink. Such a modification would be well within the scope of the invention. It is to be further understood, therefore, that numerous changes in the details of the embodiments of the invention and additional embodiments of the invention will be apparent to, and may be made by, persons of ordinary skill in the art having reference to this description. It is contemplated that all such changes and additional embodiments are within the spirit and true scope of the invention as claimed below.

What is claimed is:

1. An electronic device, comprising:

a diamond substrate to which the electronic device is coupled; and a heat transfer device for dissipating and removing heat energy from the electronic device and delivering the heat energy to a heat sink, the heat transfer device comprising:

an interconnect point for connecting to the diamond substrate for receiving the heat energy from the diamond substrate; and a fiber fused to the diamond substrate at the interconnect point for receiving the heat energy from the diamond substrate and conducting the heat energy to the heat sink.

2. The electronic device of claim 1, wherein the electronic device is coupled to the diamond substrate.

3. The electronic device of claim 1, wherein the diamond substrate further comprises a smooth, reflective surface for receiving a semiconductor substrate, the diamond substrate for receiving heat energy from the semiconductor substrate.

4. The electronic device of claim 1, wherein the fiber comprises a pitch fiber comprising a core through which the heat energy travels to the heat sink.

5. The electronic device of claim 4, wherein the pitch fiber comprises a material capable of withstanding temperatures of approximately 1900° C. without phase transformation.

6. The electronic device of claim 1, wherein the diamond substrate possesses a heat transfer coefficient of greater than approximately 5 W/cm-°K.

7. The electronic device of claim 1, wherein the diamond substrate attaches to a silicon substrate.

8. The electronic device of claim 1, wherein the pitch fiber is coupled to a composite assembly providing heat flow through the composite.

9. The electronic device of claim 1, wherein the diamond substrate is a polycrystalline diamond substrate formed in an acetylene torch-based chemical vapor deposition process.

* * * * *